United States Patent
Karp et al.

(10) Patent No.: US 9,607,948 B2
(45) Date of Patent: Mar. 28, 2017

(54) METHOD AND CIRCUITS FOR COMMUNICATION IN MULTI-DIE PACKAGES

(71) Applicant: Xilinx, Inc., San Jose, CA (US)

(72) Inventors: James Karp, Saratoga, CA (US); Vassili Kireev, San Jose, CA (US)

(73) Assignee: XILINX, INC., San Jose, CA (US)

(*) Notice: Subject to any disclaimer, the term of this patent is extended or adjusted under 35 U.S.C. 154(b) by 21 days.

(21) Appl. No.: 14/674,321

(22) Filed: Mar. 31, 2015

(65) Prior Publication Data

US 2016/0293548 A1 Oct. 6, 2016

(51) Int. Cl.
*H01L 25/00* (2006.01)
*H01L 23/538* (2006.01)
*H01L 27/02* (2006.01)
*H03K 19/173* (2006.01)

(52) U.S. Cl.
CPC ...... *H01L 23/5382* (2013.01); *H01L 23/5386* (2013.01); *H01L 25/00* (2013.01); *H01L 27/0207* (2013.01); *H03K 19/1732* (2013.01)

(58) Field of Classification Search
CPC ............. H01L 23/5382; H01L 23/5386; H01L 27/0207; H01L 25/00; H03K 19/1732
See application file for complete search history.

(56) References Cited

U.S. PATENT DOCUMENTS

| | | | |
|---|---|---|---|
| 7,919,845 B2 | 4/2011 | Karp et al. | |
| 7,999,367 B2 * | 8/2011 | Kang | G11C 5/02 257/678 |
| 8,634,221 B2 * | 1/2014 | Thayer | G06F 13/16 365/51 |
| 8,760,328 B1 | 6/2014 | Koay et al. | |
| 8,994,425 B2 * | 3/2015 | Venkata | H03K 5/1534 327/162 |
| 9,297,971 B2 * | 3/2016 | Thacker | G02B 6/4274 |
| 2009/0039492 A1 | 2/2009 | Kang et al. | |
| 2011/0206381 A1 | 8/2011 | Ji et al. | |
| 2013/0336039 A1 | 12/2013 | Frans | |

OTHER PUBLICATIONS

Specification and drawings for U.S. Appl. No. 14/297,527, filed Jun. 5, 2014, Lesea et al.
Specification and drawings for U.S. Appl. No. 14/297,535, filed Jun. 5, 2014, Trimberger et al.

* cited by examiner

*Primary Examiner* — Jung Kim
(74) *Attorney, Agent, or Firm* — LeRoy D. Maunu (57) ABSTRACT

Various example implementations are directed to circuits and methods for inter-die communication on a multi-die integrated circuit (IC) package. According to an example implementation, an IC package includes a first semiconductor die having a plurality of communication circuits for communicating data over respective data terminals of the package. The package also includes a second semiconductor die having N contacts for communicating data to and from the semiconductor die. The second semiconductor die includes a logic circuit configured to communicate M parallel data signals with one or more other semiconductor dies of the package, wherein M>N. The second semiconductor die also includes a plurality of serializer circuits, each configured to serialize data from a respective subset of the plurality of the M signal lines to produce serialized data and provide the serialized data to a respective one of the contacts.

17 Claims, 6 Drawing Sheets

METHOD AND CIRCUITS FOR COMMUNICATION IN MULTI-DIE PACKAGES

TECHNICAL FIELD

The disclosure generally relates to data communication, and more particularly to communication of data between dies of a multi-die integrated circuit (IC) package.

BACKGROUND

Programmable logic devices (PLDs) are a well-known type of programmable IC that can be programmed to perform specified logic functions. One type of PLD, the field programmable gate array (FPGA), typically includes an array of programmable tiles. These programmable tiles comprise various types of logic blocks, which can include, for example, input/output blocks (IoBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

Various example implementations are directed to circuits and methods for inter-die communication on a multi-die IC package. According to an example implementation, an IC includes a first semiconductor die having M signal lines and a logic circuit on the semiconductor die. The logic circuit is configured to communicate M data signals over the M signal lines with one or more semiconductor dies communicatively coupled to the first semiconductor die. The IC also includes a plurality of contacts on the semiconductor die. The plurality of contacts includes at least N contacts, where N is less than M. A plurality of serializer circuits on the semiconductor die are each configured to serialize data from a respective subset of the plurality of the M signal lines to produce serialized data, Each serializer circuit provides the serialized data to a respective one of the contacts.

A method for inter-die communication in a multi-die IC package is also disclosed. Using a logic circuit on a first semiconductor die of the IC package, M data signals are communicated in parallel with other dies of the IC package via M signal lines on the first semiconductor die. For each of a plurality of serializer circuits on the first semiconductor die, a respective first subset of the M data signals is serialized to produce a respective first serialized data signal. The respective first serialized data signal is provided to a respective one of N contacts of the first semiconductor die, where N<M. For each of a plurality of deserializer circuits on the first semiconductor die, a respective second serialized data signal on one of the N contacts is deserialized to produce a respective second subset of the M parallel data signals. Data signals of the respective second subset are provided to respective ones of the M signal lines.

According to an example implementation, an IC package includes a substrate and a set of data terminals, for communicating data to and from the IC package, coupled to the substrate. The IC package includes a first semiconductor die having a plurality of communication circuits for communicating data over respective data terminals of the IC package. The IC package also includes a second semiconductor die having N contacts for communicating data to and from the second semiconductor die. The second semiconductor die includes a logic circuit configured to communicate M data signals in parallel with one or more other semiconductor dies of the package, wherein M>N. The second semiconductor die also includes a plurality of serializer circuits, each configured to serialize data from a respective subset of the plurality of the M data signals to produce serialized data and provide the serialized data to a respective one of the N contacts.

Other features will be recognized from consideration of the Detailed Description and Claims, which follow.

BRIEF DESCRIPTION OF THE DRAWINGS

Various aspects and features of the methods and circuits will become apparent upon review of the following detailed description and upon reference to the drawings in which.

DETAILED DESCRIPTION

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

A multi-die IC package includes a plurality of semiconductor dies coupled together and disposed within a single package. Each semiconductor die implements a respective component of the IC package. Generally, a manufacturing fault occurring within any one of the semiconductor dies renders the IC package inoperable. The use of multiple semiconductor dies to implement respective components of an IC package allows components to be separately manufactured and tested prior to final assembly in an IC package. Accordingly, flawed components can be individually identified before being assembled into the final IC package. In this manner, the production yield for manufacture of the IC package may be increased.

Data is communicated between individual semiconductor dies in a multi-die IC package via inter-die connections between respective contacts on the semiconductor dies. An inter-die connection may include, for example, signal lines on a substrate and/or interposer in the IC package. The contacts may be connected to the signal lines using various manufacturing technologies including, for example, wirebonds, C4 solder balls, and/or microbumps. While not so limited, for ease of reference, the examples may be primarily described with reference to semiconductor dies mounted and interconnected in a semiconductor package using microbumps.

Advancements in lithography processes continue to increase the density of circuitry that can be printed in a given area of silicon. Typically, as the amount of circuitry that is integrated on a semiconductor die is increased, the number of contacts for input and output of data is increased. However, due to limitations in current manufacturing technologies, there may not be sufficient area on a semiconductor die to accommodate a desired number of contacts for communication of data to and/or from the semiconductor die. For example, for a programmable IC, thousands of parallel data signals may need to be communicated between programmable logic circuits and various communication circuits external to the programmable logic circuits. Where 28 nm lithography is used to form the programmable logic circuits on a semiconductor die, 1-2 µm pitch contacts may be needed to communicate all of the data signals from the programmable logic circuits to respective signal lines. However, currently available contacts typically have a minimum pitch of approximately 35-40 µm. Accordingly, it may not be possible to form respective contacts for each of the data signals within the silicon area of the semiconductor die.

Circuits and methods are disclosed for communicating a larger number of data signals to and/or from a semiconductor die of a multi-die IC package using a lesser number of contacts. According to an example implementation, an IC package includes a first semiconductor die having a logic circuit configured to communicate a first number (M) of data signals in parallel with one or more other semiconductor dies of the package. The first semiconductor die includes a second number (N) of contacts, which is smaller than the number of data signals. The first semiconductor die also includes one or more serializer circuits. Each serializer circuit is configured to serialize a respective subset of the M data signals to produce a serialized data signal and provide the serialized data signal to a respective one of the N contacts. Serialization arranges respective bits of the M data signals into a single data signal for sequential transmission over a single signal path. Alternatively or additionally, the first semiconductor die may include one or more deserializer circuits. Each deserializer is configured to deserialize a serialized data signal on a respective one of the N contacts to produce a subset of the M data signals. Deserialization separates a serialized data signal into component data signals for transmission on respective signal lines. For ease of reference, unserialized data signals may be referred to as parallel data signals or data signals communicated in parallel.

The disclosed implementations are applicable to IC packages having various circuits implemented by multiple interconnected semiconductor dies. For ease of explanation, the examples in the disclosure may be generally discussed with reference to an IC package including a programmable logic circuit on a first semiconductor die and one or more communication circuits on a second semiconductor die. The communication circuits on the second semiconductor die may be configured, for example, to communicate data to and/or from the IC package via a set of external data terminals of the IC package.

In some implementations, one or more of the communication circuits encode a serialized data signal communicated from the first semiconductor die to the second semiconductor die for transmission from the IC die. Alternatively or additionally, the second semiconductor die may include a deserializer circuit configured to deserialize a serialized data signal communicated from the first semiconductor die to the second semiconductor die to produce a set of parallel data signals. Each of the parallel data signals may be encoded by respective communication circuits for transmission via a respective one of the data terminals. Different communication circuits may encode serialized or parallel data signals using various communication protocols. The modulated signals produced by the communication circuits are transmitted by the communication circuits on a respective ones of the data terminals of the IC package.

In some implementations, one or more of the communication circuits on the second semiconductor die are configured to demodulate data signals received from the data terminals of the IC package and communicate the demodulated signals to the first semiconductor die as serialized data. For some communication circuits, a demodulated signal may contain serialized data that can be communicated directly to the first semiconductor die by the communication circuit. For some other communication circuits, the demodulated signals do not contain serialized data. In some implementations the second semiconductor die may include a serializer circuit configured to serialize a plurality of the demodulated signals to produce a serialized data signal for communication to the first semiconductor die.

As indicated above, the use of multiple semiconductor dies in an IC package allows circuit components in an IC package to be separately manufactured and tested prior to assembly in the IC package. However, the silicon area of the semiconductor dies may need to be increased to accommodate respective contacts for each of the data signals communicated between the semiconductor dies. Such an increase in the silicon area increases manufacturing costs of the individual semiconductor dies and the resulting IC package.

The disclosed circuits and methods for inter-die communication allow individual semiconductor dies in a multi-die IC package to be formed with area dimensions that are less than that area that would be required to include a respective contact for each inter-die data signal. By communicating data signals using fewer contacts, the silicon area of the semiconductor dies may be reduced. Accordingly, circuits in an IC package may be implemented using multiple semiconductor dies without increasing the silicon area to include additional contacts.

The use of multiple semiconductor dies in an IC package also allows different circuits to be formed using different lithography processes. For example, in some implementations, a programmable logic circuit may be formed in a first semiconductor die using a smaller lithography process size, and the communication circuit for input/output of data may be formed on a second semiconductor die using a larger lithography process size.

Figure 1:
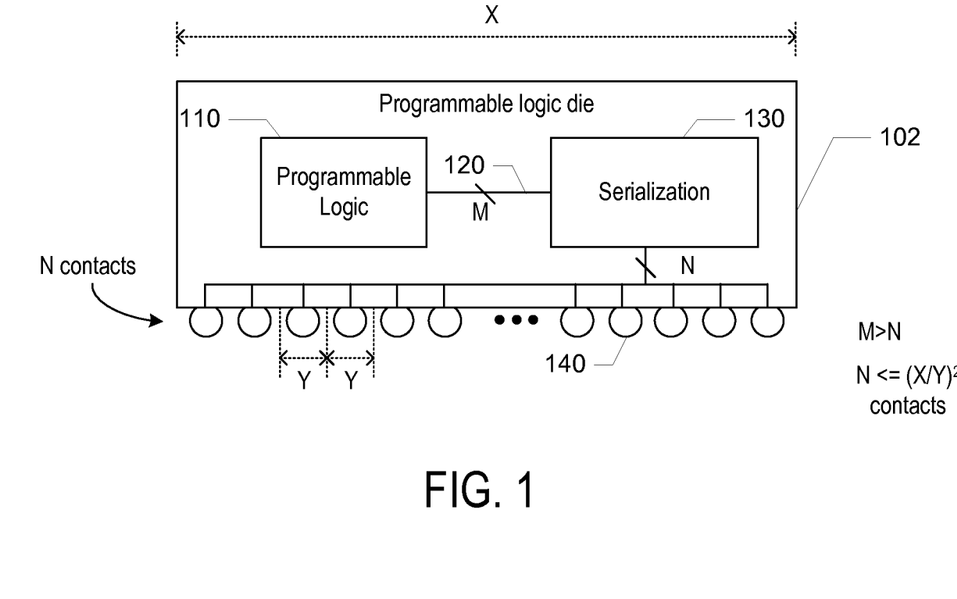
FIG. 1 shows an example semiconductor die configured for inter-die communication of a number of data signals using a smaller number of contacts.

Turning now to the figures, FIG. 1 shows an example semiconductor die configured for inter-die communication of a number of data signals using a smaller number of contacts. In this example, the semiconductor die 102 includes a plurality of contacts 140 for communication of data signals to and/or from the semiconductor die. The maximum number of contacts is limited by the total area of the semiconductor die and the area required for each contact. For example, for a square semiconductor die having length X units and square contacts having length Y units, the semiconductor die has an area of X*X units$^2$ and contacts requiring Y*Y units$^2$. Accordingly, the number (N) of contacts that may be included on the semiconductor die 102 cannot exceed $X^2/Y^2$. The semiconductor die 102 includes a logic circuit 110 configured to communicate a number (M) of data signals, greater than the number of contacts 140, in parallel with one or more other semiconductor dies of the package. In this example, the logic circuit 110 is configured to communicate each of the M data signals via a respective one of a set of parallel signal lines 120.

The first semiconductor die also includes a serialization circuit 130 having one or more serializer circuits and/or deserializer circuits coupled to the signal lines 120. Each serializer circuit in the serialization circuit 130, if any, is configured to serialize a respective first subset of the M data signals received from the programmable logic 110 to produce a respective serialized data signal. Serialization arranges data values of the M signal lines into a sequential sequence that can be communicated over a single signal line. Each serializer provides the respective serialized data signal to a respective one of the N contacts 140 for transmission to one or more other dies in the IC package.

Each deserializer circuit in the inter-die communication circuit 130, if any, is configured to deserialize a serialized signal received from another die of the IC package via a respective one of the contacts 140 to produce a respective second subset of the M data signals. Deserialization arranges M sequential data values of a serialized data signal for communication as M parallel data signals over respective signal lines. The M data signals of the respective second subset are provided to respective ones of the signal lines 120.

Figure 2:
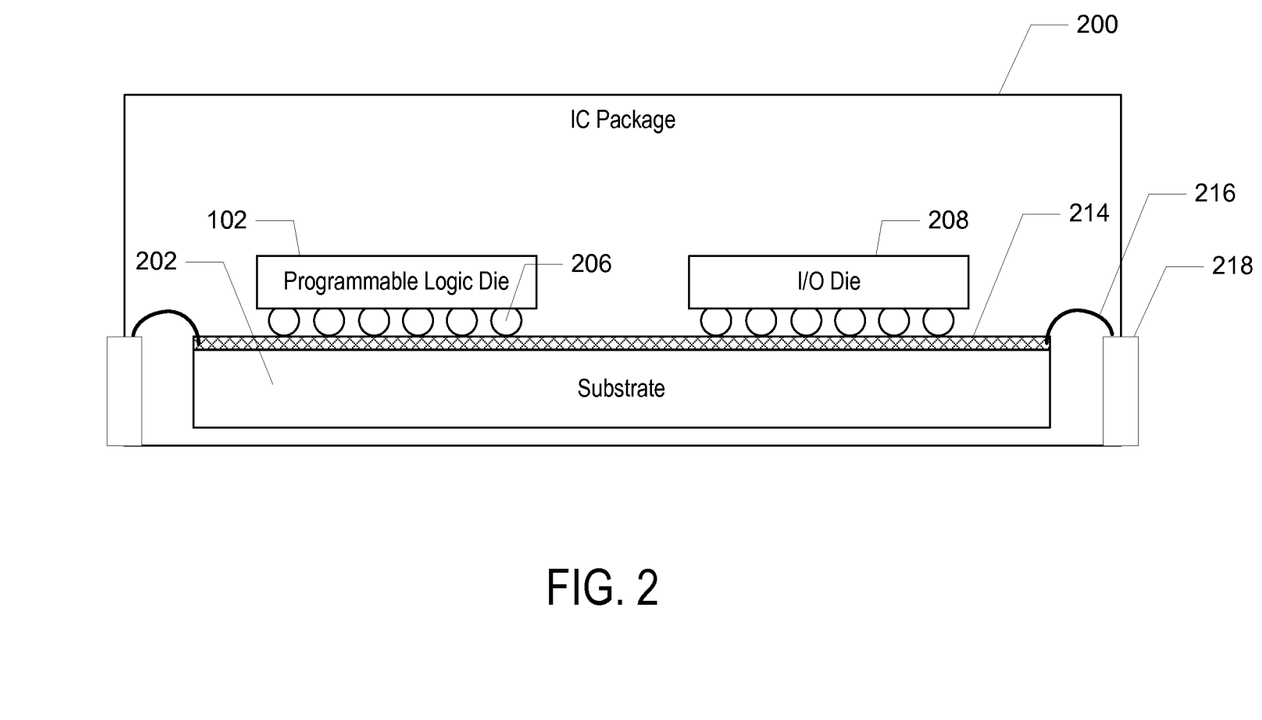
FIG. 2 shows a cross section of a first IC package having first and second semiconductor dies configured for inter-die communication.

FIG. 2 shows a cross section of a first IC package having first and second semiconductor dies configured for inter-die communication. The IC package 200 includes a programmable logic die 102 and an I/O die 208 coupled to a substrate 202 by a set of microbumps 206. Each of the microbumps 206 is a ball of solder that electrically couples a respective contact (not shown) on one of the dies to a respective contact (not shown) connected to wiring layer 214 on the substrate 202. The wiring layer 214 includes a plurality of respective signal lines (not shown in FIG. 2) for routing data signals between various locations on the wiring layer. During manufacture of the IC package 200, microbumps 206 may be initially attached to contacts on the semiconductor dies 102 and 208. The microbumps 206 can then be aligned with corresponding contacts on the substrate 202. The microbumps 206 are reflowed to form an electrical connection between contacts of the dies and contacts on the substrate 202.

As described with reference to FIG. 1, the programmable logic die 102 includes a programmable logic circuit 110 configured to communicate a number of data signals with other dies in the IC. The programmable logic die 102 also includes an inter-die communication circuit 130 having serializer circuits and/or deserializer circuits for communicating the M data signals between the programmable logic die 102 and the I/O die 208 as serialized data signals. Each of the serialized data signals is communicated between the programmable logic die 102 and the I/O die 208 on a respective inter-die communication path including a respective signal line in the wiring layer 214, a first one of the microbumps 206 coupling the programmable logic die 102 to the signal line, and a second one of the microbumps 206 coupling the I/O die 208 to the signal line in the wiring layer 214.

The IC package also includes a plurality of data terminals 218 for communicating data to and/or from the IC package 200. In this example, data terminals 218 are communicatively coupled to the wiring layer 214 on the substrate 202 via bond wires 216. As another example, in some implementations, data terminals may be formed on the substrate 202 and connected directly to the wiring layer 214.

The I/O die 208 includes a plurality of communication circuits configured to communicate data signals to or from the IC package via the data terminals 218. Data signals are transmitted and/or received by a communication circuit via a signal path including one of the microbumps 206, a signal line of the wiring layer 214, one of the bondwires 216, and one of the data terminals 218. In different implementations, communication circuits of the I/O die 208 may communicate data to and from the IC package 200 in either serialized or unserialized formats. Moreover, different communication circuits may transmit or receive data using various communication protocols including, for example, AXI, PCIe, and/or Ethernet.

In the example shown in FIG. 2, the programmable logic die 102 and the I/O die 208 are directly coupled to the substrate wiring layer 214 via the microbumps. In some implementations, one or more semiconductor dies may be indirectly coupled to substrate wiring layer 214, for example, via an interposer, or may be stacked on and coupled to another one of the semiconductor dies.

Figure 3:
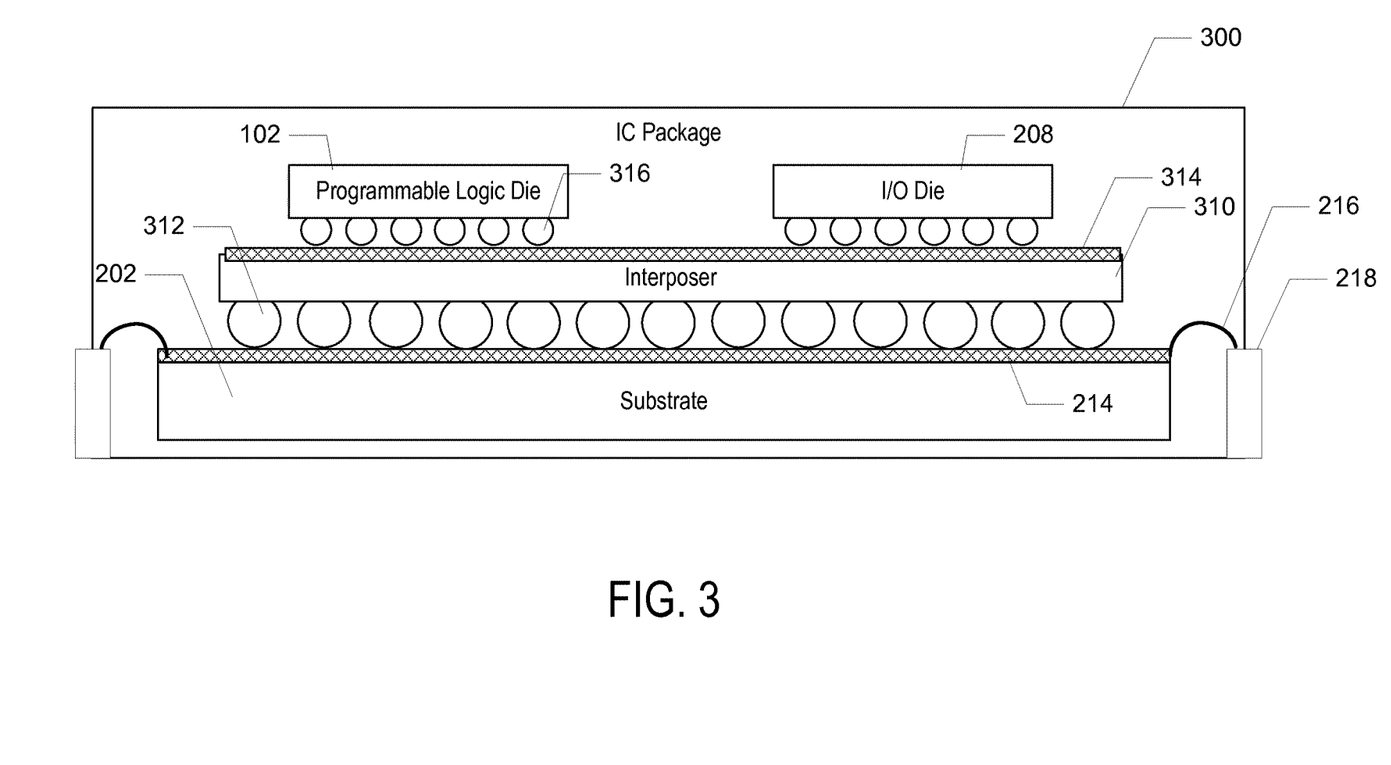
FIG. 3 shows a cross section of a second IC package having first and second semiconductor dies configured for inter-die communication.

FIG. 3 shows a cross section of an example IC package having first and second semiconductors indirectly coupled to a substrate via an interposer. The IC package 300 includes a substrate 202, wiring layer 214, data terminals 218, bondwires 216, a programmable logic die 102, and an I/O die 208, as described with reference to FIG. 2. In this example, the programmable logic die 102, and the I/O die 208 are mounted on an interposer 310. Contacts of the programmable logic die 102 and an I/O die 208 are coupled to second wiring layer 314 on the interposer 310 by a set of microbumps 316. Serialized data signals are communicated between the programmable logic die 102 and the I/O die 208 via respective signal paths. Each of the signal paths between the programmable logic die 102 and the I/O die 208 includes a respective signal line of the wiring layer 314, a respective first microbump coupling the programmable logic die 102 to the signal line, and a respective second microbump coupling the I/O die 208 to the signal line.

The interposer 310 includes a number of vias (not shown in FIG. 3), each coupling a respective signal line in the wiring layer 314 to a respective one of the C4 solderballs 312 on a bottom side of the interposer 310. The C4 solderballs 312 are mounted on and coupled to the respective signal lines in wiring layer 214 on the substrate 202. In this example, each data signal communicated to and from the IC package 300 by the I/O die 208 is communicated on a respective path though one of the microbumps, a signal line in wiring layer 314, a via of interposer 310, one of the C4 solderballs, a signal line in wiring layer 214, a bondwire 216, and one of the data terminals 218.

Figure 4:
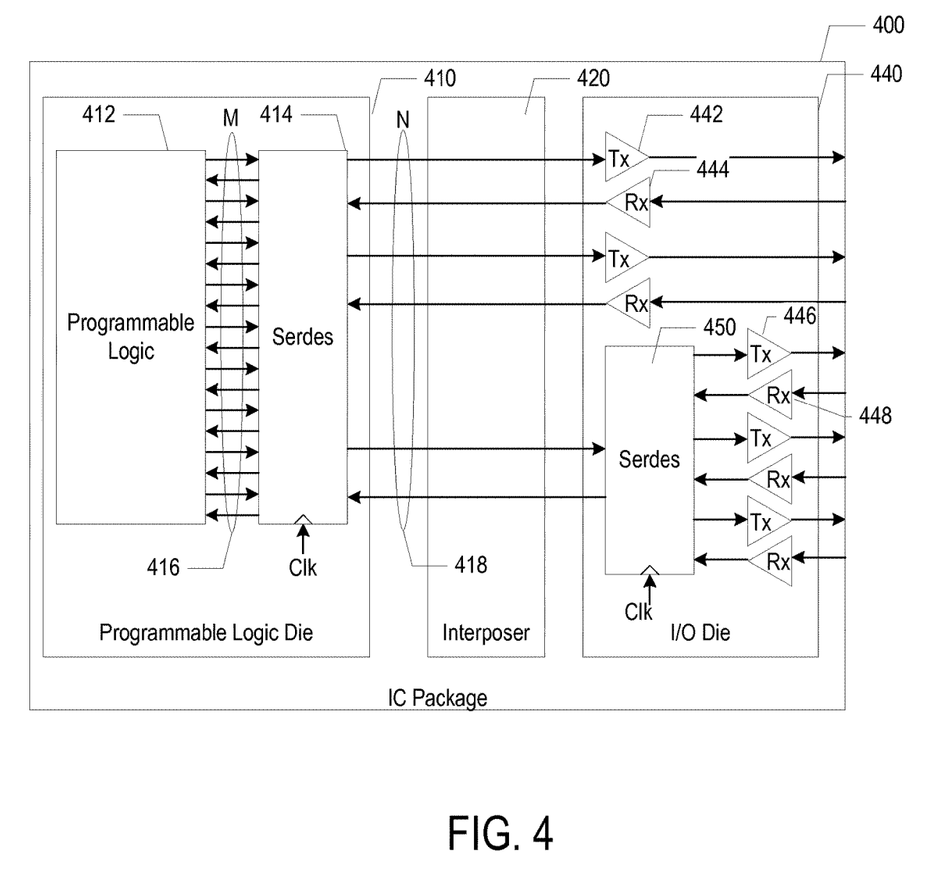
FIG. 4 shows a block diagram of example circuits for inter-die communication.

FIG. 4 shows a block diagram of example circuits for inter-die communication in an IC package. In this example, the IC package 400 includes a programmable logic die 410 coupled to an I/O die 440 by an interposer 420. The programmable logic die 410 includes a programmable logic circuit 412 configured to communicate M data signals with the I/O die 440 in parallel over M signal lines 416. The programmable logic die 410 also includes a serializer/deserializer (serdes) circuit 414 configured to communicate the M data signals as serialized data signals on N respective signal paths 418 though interposer 420, which are coupled to contacts of the programmable logic die 410. More specifically, the serdes circuit 414 serializes data of respective groups of the signal lines 416 to produce respective serialized signals. Each of the respective serialized signals is communicated to the I/O die 440 via a respective one of the signal paths 418. The number of signal paths N is less than the number of data signals M. The serdes circuit 414 also deserializes respective serialized data signals received from the I/O die 440 into a plurality of parallel signals, which are each provided to the programmable logic circuit via respective one of the signal lines 416.

The I/O die 440 includes a plurality of communication circuits 442, 444, 446, and 448 configured to communicate data signals either to or from the IC package 400. The I/O die 440 may include various communication circuits having different configurations. In some implementations, one or more communication circuits are configured to communicate data to or from the IC package in a serialized data format. In this example, a first communication circuit 442 is configured to transmit a serialized data signal received from the programmable IC die 410 via a data terminal of the IC package 400. A second communication circuit 444 is configured to receive data input to the IC package in a serialized format and provide the serialized data to the programmable logic die 410.

In some implementations, one or more communication circuits are configured to communicate data to or from the IC package in an unserialized data format. For instance, the I/O die 440 includes a serdes circuit 450 configured to deserialize a serialized data signal from the programmable IC die 410 to produce a set of parallel signals. Each of the parallel signals is transmitted from the I/O die 440 by a respective communication circuit 446. Conversely, the serdes circuit 450 may be configured to serialize parallel signals received by respective communication circuits 448 to produce a serialized data signal, which is provided to the programmable IC die via one of the signal lines 418.

Figure 5:
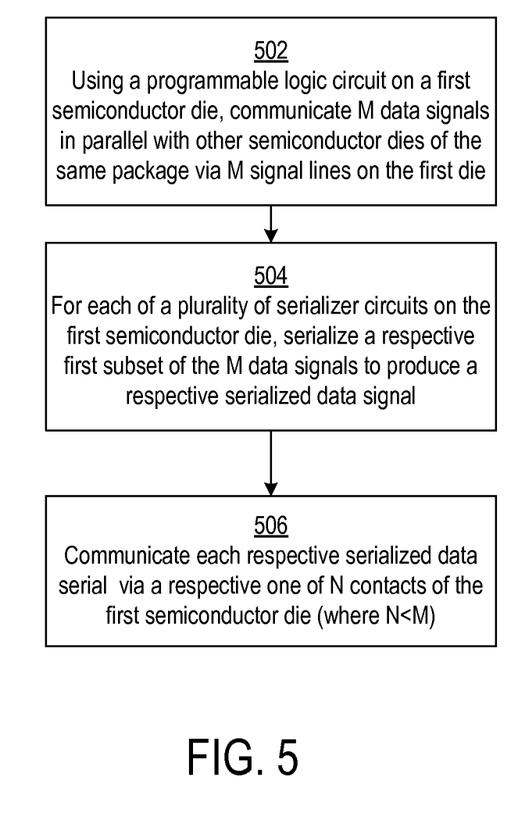
FIG. 5 shows an example process for communicating data from a semiconductor die in a multi-die IC package.

FIG. 5 shows an example process for communicating data from an IC die in a multi-die IC package. At block 502, a programmable logic circuit on a first semiconductor die is used to communicate M data signals in parallel with other semiconductor dies in the same IC via M signal lines on the first semiconductor die. At block 504, for each of a plurality of serializer circuits on the first semiconductor die, a respective first subset of the M data signals is serialized to produce a respective serialized data signal. At block 506, each respective serialized data signal is communicated via a respective one of N contacts of the first semiconductor die. The number of contacts N is less than the number of data signals M.

Figure 6:
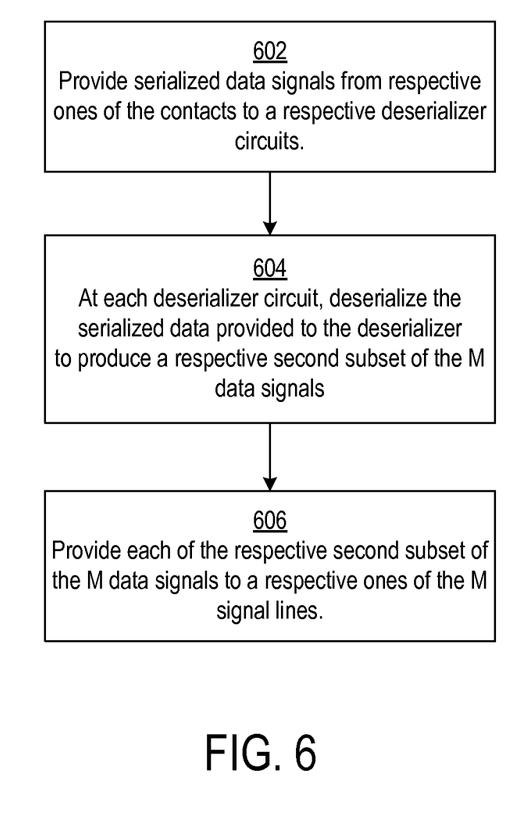
FIG. 6 shows an example process for communicating data to a semiconductor die in a multi-die IC package.

FIG. 6 shows an example process for communicating data to an IC die in a multi-die IC package. At block 602, serialized data signals is are provided from respective ones of the contacts to a respective deserializer circuits. At block 604, the serialized data signal provided to each deserializer circuit is deserialized to produce a respective second subset of the M data signals. At block 606, each of the respective second subset of the M data signals is provided to a respective one of the M signal lines.

While the above examples are primarily discussed with reference to communication of serialized data signals between semiconductor dies in a multi-die IC package, some implementations may also communicate parallel data signals between the semiconductor dies. For example, referring again to FIG. 1, the programmable logic die 102 may be adapted to communicate a first subset of the M data signals via respective contacts in parallel. A second subset of the M data signals may be communicated by the serialization circuit 130 in a serialized format as previously discussed.

Serializer and/or deserializer circuits on a programmable logic die may be implemented as hardwired circuits on the die or by programmable logic resources on the die. Implementing hardwired circuits in programmable logic allows the inter-die communication circuit to be adapted to suit the communication requirements of a user circuit design implemented in programmable logic. In some implementations, a software circuit design tool may be configured to assist in the creation and/or configuration of serialization and/or deserialization circuits for communication of signals to and/or from a user circuit design to be implemented in programmable logic. For example, the software circuit design tool may determine a number of signals required to be communicated in a serialized format based on a number of I/O signals in a user circuit design and a number of available I/O contacts of a programmable logic die in a target programmable IC package. The number of available I/O contacts of the programmable logic die may be determined, for example, from a database indicating a respective number of available I/O contacts for various programmable IC packages. After determining the number of signals required to be communicated in a serialized format, the software circuit design tool may automatically instantiate serialization/deserialization circuits in the user circuit design to communicate the number of signals in serial.

In some implementations, the software circuit design tool may select ones of I/O signals of the user circuit design to be serialized based on communication requirements of the I/O signals. For example, the software design tool may automatically select I/O signals having the slowest transfer rate for serialization. Conversely, I/O signals having the highest transfer rate may be selected to be communicated in an unserialized format. As another example, the software design tool may group I/O signals to be serialized together based on required transfer rates of the I/O signals and the transfer rate of the I/O contacts. After selecting ones of the I/O signals to be serialized, the software circuit design tool may automatically connect signal lines corresponding to the selected I/O signals to the instantiated serialization/deserialization circuits in the user circuit design.

Figure 7:
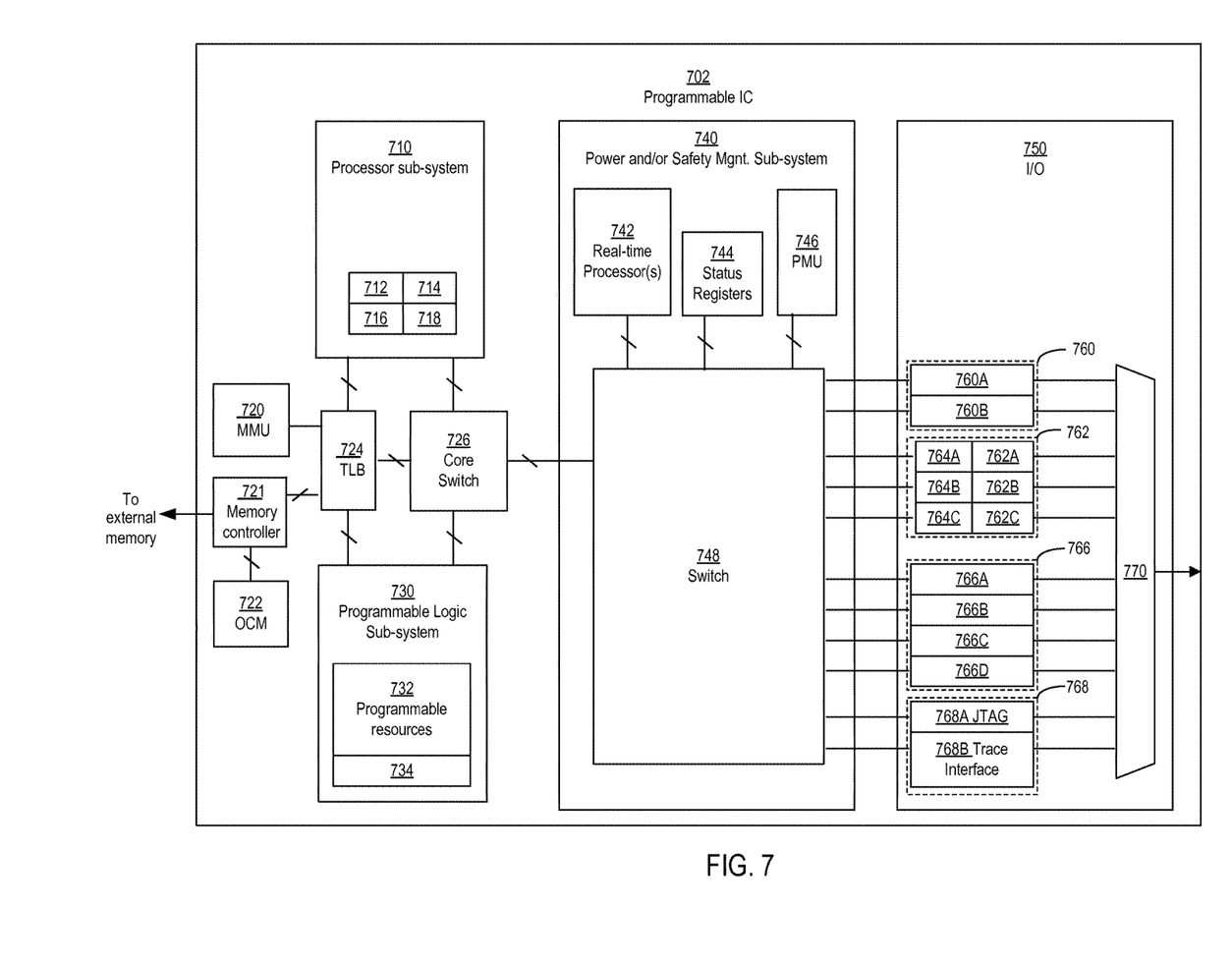
FIG. 7 shows a programmable IC that may be configured in accordance with one or more implementations.

FIG. 7 shows a programmable IC 702 that may be configured in accordance with one or more implementations. The programmable IC may also be referred to as a System On Chip (SOC), which includes a processing sub-system 710 and a programmable logic sub-system 730. In this example, the programmable IC also includes a sub-system 740 having various circuits for power and/or safety management and an input/output (I/O) sub-system 750 for communication of data with external circuits. The subsystems 710, 730, 740, and 750 may be formed using a plurality of semiconductor dies, and interconnected in an IC package as described in the above examples.

The processing sub-system 710 may be programmed to implement a software portion of the user design, via execution of a user program. The program may be specified as part of a configuration data stream or may be retrieved from an on-chip or off-chip data storage device. The processing sub-system 710 may include various circuits 712, 714, 716, and 718 for executing one or more software programs. The circuits 712, 714, 716, and 718 may include, for example, one or more processor cores, floating point units (FPUs), an interrupt processing unit, on chip-memory, memory caches, and/or cache coherent interconnect.

The programmable logic sub-system 730 of the programmable IC 702 may be programmed to implement a hardware portion of a user design. For instance, the programmable logic sub-system may include a number of programmable resources 732, which may be programmed to implement a set of circuits specified in a configuration data stream. The programmable resources 732 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 732 may be programmed by loading a configuration data stream into the configuration memory cells, which define how the programmable interconnect circuits and programmable logic circuits are configured. The collective states of the individual memory cells then determine the function of the programmable resources 732. The configuration data can be read from memory (e.g., from an external PROM) or written into the programmable IC 702 by an external device. In some implementations, configuration data may be loaded into configuration memory cells by a configuration controller 734 included in the programmable logic sub-system 730. In some other implementations, the configuration data may be loaded into the configuration memory cells by a start-up process executed by the processor sub-system 710.

The programmable IC 702 may include various circuits to interconnect the processing sub-system 710 with circuitry implemented within the programmable logic sub-system 730. In this example, the programmable IC 702 includes a core switch 726 that can route data signals between various data ports of the processing sub-system 710 and the programmable logic sub-system 730. The core switch 726 may also route data signals between either of the programmable logic or processing sub-systems 710 and 730 and various other circuits of the programmable IC, such as an internal data bus. Alternatively or additionally, the processing sub-system 710 may include an interface to directly connect with the programmable logic sub-system—bypassing the core switch 726. Such an interface may be implemented, for example, using the AMBA AXI Protocol Specification (AXI) as published by ARM.

In some implementations, the processing sub-system 710 and the programmable logic sub-system 730 may also read or write to memory locations of an on-chip memory 722 or off-chip memory (not shown) via memory controller 721. The memory controller 721 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 721 is able to communicate is provided for purposes of illustration only and is not intended as a limitation or to be exhaustive. As shown in FIG. 7, the programmable IC 702 may include a memory management unit 720 and translation look-aside buffer 724 to translate virtual memory addresses used by the sub-systems 710 and 730 to physical memory addresses used by the memory controller 721 to access specific memory locations.

In this example, the programmable IC includes an I/O sub-system 750 for communication of data with external circuits. The I/O sub-system 750 may include various types of I/O devices or interfaces including for example, flash memory type I/O devices, higher performance I/O devices, lower performance interfaces, debugging I/O devices, and/or RAM I/O devices.

The I/O sub-system 750 may include one or more flash memory interfaces 760 illustrated as 760A and 760B. For example, one or more of flash memory interfaces 760 can be implemented as a Quad-Serial Peripheral Interface (QSPI) configured for 4-bit communication. One or more of flash memory interfaces 760 can be implemented as a parallel 8-bit NOR/SRAM type of interface. One or more of flash memory interfaces 760 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 750 can include one or more interfaces 762 providing a higher level of performance than flash memory interfaces 760. Each of interfaces 762A-762C can be coupled to a DMA controller 764A-764C respectively. For example, one or more of interfaces 762 can be implemented as a Universal Serial Bus (USB) type of interface. One or more of interfaces 762 can be implemented as a gigabit Ethernet type of interface. One or more of interfaces 762 can be implemented as a Secure Digital (SD) type of interface.

The I/O sub-system 750 may also include one or more interfaces 766 such as interfaces 766A-766D that provide a lower level of performance than interfaces 762. For example, one or more of interfaces 766 can be implemented as a General Purpose I/O (GPIO) type of interface. One or more of interfaces 766 can be implemented as a Universal Asynchronous Receiver/Transmitter (UART) type of interface. One or more of interfaces 766 can be implemented in the form of a Serial Peripheral Interface (SPI) bus type of interface. One or more of interfaces 766 can be implemented in the form of a Controller-Area-Network (CAN) type of interface and/or an I$^2$C type of interface. One or more of interfaces 766 also can be implemented in the form of a Triple Timer Counter (TTC) and/or a Watchdog Timer (WDT) type of interface.

The I/O sub-system 750 can include one or more debug interfaces 768 such as processor JTAG (PJTAG) interface 768A and a trace interface 768B. PJTAG interface 768A can provide an external debug interface for the programmable IC 702. Trace interface 768B can provide a port to receive debug, e.g., trace, information from the processing sub-system 710 or the programmable logic sub-system 730.

As shown, each of interfaces 760, 762, 766, and 768 can be coupled to a multiplexer 770. Multiplexer 770 provides a plurality of outputs that can be directly routed or coupled to external pins of the programmable IC 702, e.g., balls of the package within which the programmable IC 702 is disposed. For example, I/O pins of programmable IC 702 can be shared among interfaces 760, 762, 766, and 768. A user can configure multiplexer 770, via a configuration data stream to select which of interfaces 760-768 are to be used and, therefore, coupled to I/O pins of programmable IC 702 via multiplexer 770. The I/O sub-system 750, may also include a fabric multiplexer I/O (FMIO) interface (not shown) to connect interfaces 762-768 to programmable logic circuits of the programmable logic sub-system. Additionally or alternatively, the programmable logic sub-system 730 can be configured to implement one or more I/O circuits within programmable logic. In this example, the programmable IC 702 includes sub-system 740 having various circuits for power and/or safety management. For example, the sub-system 740 may include a power management unit 746 configured to monitor and maintain one or more voltage domains used to power the various sub-systems of the programmable IC 702. In some implementations, the power management unit 746 may disable power of individual sub-systems, when idle, to reduce power consumption, without disabling power to sub-systems in use.

The sub-system 740 may also include safety circuits to monitor the status of the sub-systems to ensure correct operation. For instance, the sub-system 740 may include one or more real-time processors 742 configured to monitor the status of the various sub-systems (e.g., as indicated in status registers 744). The real-time processors 742 may be configured to perform a number of tasks in response to detecting errors. For example, for some errors, the real-time processors 742 may generate an alert in response to detecting an error. As another example, the real-time processors 742 may reset a sub-system to attempt to restore the sub-system to correct operation. The sub-system 740 includes a switch network 748 that may be used to interconnect various sub-systems. For example, the switch network 748 may be configured to connect the various sub-systems 710, 730, and 740 to various interfaces of the I/O sub-system 750. In some applications, the switch network 748 may also be used to isolate the real-time processors 742 from the sub-systems that are to be monitored. Such isolation may be required by certain application standards (e.g., IEC-61508 SIL3 or ISO-26262 standards) to ensure that the real-time processors 742 are not affected by errors that occur in other sub-systems.

The methods and circuits are thought to be applicable to a variety of multi-die packages. Other aspects and features will be apparent to those skilled in the art from consideration of the specification. For example, though aspects and features may in some cases be described in individual figures, it will be appreciated that features from one figure can be combined with features of another figure even though the combination is not explicitly shown or explicitly described as a combination. It is intended that the specification and drawings be considered as examples only, with a true scope of the invention being indicated by the following claims.

What is claimed is:

1. An apparatus, comprising:
an interposer;
a first semiconductor die disposed on the interposer;
a second semiconductor die disposed on the interposer;
M signal lines on the first semiconductor die;
a logic circuit on the first semiconductor die, the logic circuit configured to communicate M data signals, via the M signal lines, with the second semiconductor die communicatively coupled to the first semiconductor die;
a plurality of contacts on the first semiconductor die including at least N contacts, wherein the number of N contacts is less than the number of M signal lines and each contact is coupled to the second semiconductor die via a respective signal path; and
a plurality of serializer circuits on the first semiconductor die, each configured to serialize data from a respective subset of the plurality of the M signal lines to produce serialized data and provide the serialized data to a respective one of the contacts;
a deserializer circuit disposed on the second semiconductor die and coupled to receive the serialized data from the first semiconductor die via a respective one of the signal paths, wherein the deserializer circuit is configured to:
deserialize the serialized data to produce a set of parallel data signals; and
provide each data signal of the set of parallel data signals on a respective data terminal.

2. The apparatus of claim 1, wherein:
the second semiconductor die and the first semiconductor die are disposed in an integrated circuit (IC) package having a set of data terminals for communication of data to and from the IC package; and
the second semiconductor die includes a plurality of communication circuits, each configured to receive a data signal from the deserializer circuit and communicate data via a respective one of the set of data terminals.

3. The apparatus of claim 2, wherein the first semiconductor die further includes a plurality of deserializer circuits, each configured to receive serialized data from a respective one of the contacts and to produce deserialized data and distribute the deserialized data to a respective plurality of the M signal lines.

4. The IC package of claim 2, wherein at least one of the plurality of communication circuits of the second semiconductor die is coupled to receive serialized data from a respective one of the signal paths and is configured to transmit the serialized data via the respective one of the set of data terminals.

5. An apparatus, comprising:
an integrated circuit (IC) package having a set of data terminals for communication of data to and from the IC package;
a first semiconductor die disposed in the IC package;
one or more semiconductor dies including a second semiconductor die disposed in the package;
M signal lines on the first semiconductor die;
a logic circuit on the first semiconductor die, the logic circuit configured to communicate M data signals, via the M signal lines, with the one or more semiconductor dies communicatively coupled to the first semiconductor die;
a plurality of contacts on the first semiconductor die including at least N contacts, wherein the number of N contacts is less than the number of M signal lines and each contact is coupled to another one of the one or more semiconductor dies via a respective signal path;
a plurality of serializer circuits on the first semiconductor die, each configured to serialize data from a respective subset of the plurality of the M signal lines to produce serialized data and provide the serialized data to a respective one of the contacts;
wherein the second semiconductor die includes:
a plurality of communication circuits, each configured to communicate data via a respective one of the set of data terminals; and a deserializer circuit coupled to receive the serialized data from the first semiconductor die via a respective one of the signal paths and configured to:
    deserialize the serialized data to produce a set of parallel data signals; and
    provide each data signal of the set of parallel data signals to a respective communication circuit of the plurality of communication circuits, wherein the respective communication circuit is configured to transmit the data signal on a respective one of the data terminals.

6. The IC package of claim 2, wherein at least one communication circuit of the plurality of communication circuits of the second semiconductor die is configured to:
    demodulate a signal received from the respective data terminal to produce a demodulated signal including serialized data; and
    transmit the demodulated signal to the logic circuit via a respective one of the signal paths.

7. The IC package of claim 2, wherein:
    two or more of the plurality of communication circuits are each configured to demodulate a respective signal received from the respective data terminal to produce a respective demodulated signal; and
    the second semiconductor die further includes a serializer circuit configured to serialize the demodulated signals produced by the two or more of the plurality of communication circuits to produce a respective serialized signal and transmit the respective serialized signal to the first semiconductor die via one of the signal paths.

8. The IC package of claim 2, wherein:
    the first semiconductor die includes a plurality of programmable logic resources having a first lithography process size; and
    circuits of the second semiconductor die have a second lithography process larger than the first lithography process size.

9. The IC package of claim 2, further comprising:
    a substrate in the IC package; and
    an interposer on the substrate and configured to couple each of the contacts of the second semiconductor die to a respective contact of another one of the plurality of semiconductor dies.

10. The IC package of claim 9, further comprising one or more wiring layers on the substrate and configured to couple each of the contacts of the second semiconductor die to a respective contact of another one of the plurality of semiconductor dies.

11. The IC package of claim 1, wherein:
    the first semiconductor die has an area equal to X units$^2$;
    each contact is located in a respective contact area including Y units$^2$ of the X units$^2$ of the first semiconductor die; and
    the number of N contacts is less than or equal to X/Y.

12. A method for inter-die communication in a multi-die IC package having data terminals for communication of data to and from the IC package comprising:
    using a logic circuit on a first semiconductor die of the IC package, communicating M data signals in parallel with other dies of the IC package via M signal lines on the first semiconductor die; and
    for each of a plurality of serializer circuits on the first semiconductor die:
        serializing a respective first subset of the M data signals to produce a respective first serialized data signal; and
        providing the respective first serialized data signal to a respective one of N contacts of the first semiconductor die, wherein N<M; and
    for each of a plurality of deserializer circuits on the first semiconductor die:
        deserializing a respective second serialized data signal on one of the N contacts to produce a respective second subset of the M data signals; and
        providing each data signal of the respective second subset to a respective one of the M signal lines;
    providing the first serialized data signal from the respective one of the N contacts to a second semiconductor die of the IC package;
    using a deserializer circuit on the second semiconductor die, deserializing the first serialized data signal to produce a plurality of parallel data signals; and
    using respective communication circuits on the second semiconductor die, transmitting the plurality of parallel data signals via the respective data terminals of the IC package.

13. The method of claim 12, wherein the providing of the first serialized data signal to the second semiconductor die includes communicating the first serialized data signal to the second semiconductor die via an interposer.

14. The method of claim 12, wherein the providing of the first serialized data signal to the second semiconductor die includes communicating the first serialized data signal via a signal line on a substrate of the IC package.

15. The method of claim 12, further comprising, using a serializer circuit on the second semiconductor die, serializing data signals from a plurality of data terminals to produce the respective second serialized data signal for one of the plurality of deserializer circuits on the first semiconductor die.

16. The method of claim 12, wherein
    circuits of the first semiconductor die are formed using lithography having a first process size;
    circuits of the second semiconductor die are formed using lithography having a second process size larger than the first process size;
    the first semiconductor die has an area equal to X units$^2$; and
    each of the N contacts is located in a respective contact area including greater than (X/M) units$^2$ of the first semiconductor die.

17. An integrated circuit (IC) package, comprising:
    a substrate;
    a set of data terminals coupled to the substrate for communication of data to and from the IC package; and
    a plurality of semiconductor dies disposed on and coupled to the substrate and including at least a first semiconductor die and a second semiconductor die, wherein:
        the first semiconductor die includes a plurality of communication circuits, each configured to communicate data via a respective one of the set of data terminals; and
        the second semiconductor die includes:
            a logic circuit configured to communicate M data signals in parallel with one or more other ones of the plurality of semiconductor dies, including at least the first semiconductor die, via M signal lines on the second semiconductor die;
            a plurality of contacts including at least N contacts, wherein the number of N contacts is less than the number of M signal lines and each contact is coupled to another one of the plurality of semiconductor dies via a respective signal path; and a plurality of serializer circuits, each configured to serialize data from a respective subset of the plurality of the M signal lines to produce serialized data and provide the serialized data to a respective one of the contacts; and the first semiconductor die further includes a deserializer circuit coupled to receive the serialized data from the second semiconductor die via a respective one of the signal paths and the deserializer circuit is configured to:

deserialize the serialized data to produce a set of parallel data signals; and provide each data signal of the set of parallel data signals to a respective communication circuit of the plurality of communication circuits.

\* \* \* \* \*